(12) United States Patent
Dvorak et al.

(10) Patent No.: US 7,514,972 B2
(45) Date of Patent: Apr. 7, 2009

(54) DIFFERENTIAL CHARGE PUMP WITH OPEN LOOP COMMON MODE

(75) Inventors: Mark D. Dvorak, Waseca, MN (US);
James G. Hiller, Minnetonka, MN (US);
James D. Seefeldt, Eden Prairie, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/342,106

(22) Filed: Jan. 27, 2006

(65) Prior Publication Data

US 2007/0176655 A1    Aug. 2, 2007

(51) Int. Cl.
*H03L 7/06* (2006.01)
(52) U.S. Cl. ................................. 327/157; 327/108
(58) Field of Classification Search ................. 327/148, 327/156, 158, 157, 162; 331/17, 25; 375/374, 375/375
See application file for complete search history.

(56) References Cited

U.S. PATENT DOCUMENTS

| | | | |
|---|---|---|---|
| 4,479,091 A | 10/1984 | Yoshisato | 331/17 |
| 6,256,362 B1 | 7/2001 | Goldman | 375/373 |
| 6,441,691 B1 | 8/2002 | Jones et al. | 331/25 |
| 6,611,160 B1 * | 8/2003 | Lee et al. | 327/157 |
| 6,617,888 B2 * | 9/2003 | Volk | 327/67 |
| 6,683,930 B1 | 1/2004 | Dalmia | 375/376 |
| 6,856,202 B2 | 2/2005 | Lesso | 331/1 A |

OTHER PUBLICATIONS

U.S. Appl. No. 11/254,281, filed Oct. 20, 2005, Jeffrey J. Kriz.
U.S. Appl. No. 11/254,569, filed Oct. 20, 2005, James D. Seefeldt et al.
U.S. Appl. No. 11/254,474, filed Oct. 20, 2005, James D. Seefeldt.
U.S. Appl. No. 11/254,466, filed Oct. 20, 2005, James D. Seefeldt.
U.S. Appl. No. 11/335,749, filed Jan. 19, 2006, Jon E. Josephson.
Dong Pan, et al, "A Radiation-Hard Phase-Locked Loop," IEEE 2003, pp. 1-6.

* cited by examiner

*Primary Examiner*—Quan Tra
*Assistant Examiner*—Khareem E Almo
(74) *Attorney, Agent, or Firm*—McDonnell Boehnen Hulbert & Berghoff LLP

(57) ABSTRACT

A differential charge pump with common mode and active regulators is presented. Either type of regulator may be used to improve the performance characteristics of the differential charge pump. The active regulator increases the output range of the differential amplifier. The common mode regulator establishes the common mode voltage of the differential charge pump. The common mode voltage is established independently from external circuitry and does not use a feedback path. The common mode regulator may also be used to establish a mid-rail voltage, which may be used to further improve the output range of the differential amplifier.

12 Claims, 4 Drawing Sheets

DIFFERENTIAL CHARGE PUMP WITH OPEN LOOP COMMON MODE

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to the field of integrated circuit charge pumps and more particularly to a differential charge pump with active and common mode regulators.

BACKGROUND

As Integrated Circuits (ICs) continue to become more advanced, the transistors that are used to construct them continue to decrease in size. Decreases in transistor size create changes in operating specifications associated with smaller transistors. Such changes include decreased operating voltages and tighter common mode voltage tolerances.

One type of device that is affected by decreased operating voltage and tighter common mode voltage tolerances is a charge pump. Charge pumps are fundamental components of many types of devices. For example, a charge pump may be used to adjust the amount of voltage applied to a low pass filter in a phase locked loop. One such charge pump (a differential charge pump) is illustrated in FIG. 1. Charge pump 10 includes a current steerer 12 which is coupled to receive a source current from a current source 14 and a sink current from a current sink 16. The current steerer distributes the source and sink current to output terminals NEG 18 and POS 20. Signals applied to a differential control (differential input terminals 22A-D) may be used to determine a duty cycle associated with the amount of time the source and sink currents are steered to a respective output terminal.

The output terminals 18 and 20 may each be coupled to a capacitor that uses the source and sink currents to charge and discharge. By changing the duty cycle, via the differential inputs 22A-D, the amount of voltage stored on a particular capacitor may be adjusted. For example, if the capacitors are used in a loop filter (in a phase locked loop), the voltage level on each capacitor may be used to differentially control the output frequency of a voltage controlled oscillator.

Because the current steerer 12 is comprised of Field Effect Transistors (FETs) 24-27, decreasing operating voltages (which may be associated with decreasing transistor sizes) have a direct impact on the output current range of current steerer 12. This becomes apparent by examining nodes 28 and 30. The maximum voltage at node 28 and the maximum voltage at node 30 limit the maximum range of output voltage available for input voltages at FETs 24-27. For example, as operating voltages decrease, a larger percentage of an operating voltage intended for FETs 24-27 may be distributed across current source 14 and current sink 16. When this happens less voltage is available for nodes 28 and 30, and as a result, the output current range of current steerer 12 is reduced.

Another shortcoming with current charge pumps is common mode voltage drift. Common mode voltage drift occur when small asymmetries in the charge pump 12 (or asymmetries in the circuit referencing the charge pump) may cause the positive or negative DC voltage across output terminals 18 and 20 to drift to an undesirable voltage level. For example, due to statistical variations that occur in manufacturing (i.e., semiconductor processing), FET 24 may have a smaller channel length ($\Delta L$), channel width ($\Delta W$), and/or threshold voltage ($\Delta V_t$) than FET 25. Over time, small differences in current resulting from an asymmetry may cause a capacitor referencing output terminal 20 to store a small increment of charge at each clock cycle. Another capacitor referencing output terminal 18 may not store this increment of charge. A DC voltage, therefore, is established between output terminals and it may grow, or drift, with each clock cycle.

Current charge pumps employ a feedback mechanism that monitors the DC, or common mode, voltage. By monitoring the common mode voltage through a feedback path, and adjusting the charge pump based on the feedback, a feedback mechanism may compensate for the asymmetry. This may be done by adjusting the duty cycle applied to the current steerer 12, for example. Unfortunately, the feedback mechanism increases the complexity of the charge pump and produce additional overhead. The problems associated with asymmetry may also be further exacerbated with decreased transistor sizes.

Therefore there is a need for a charge pump that has an output range that is not restricted by device scaling and processing asymmetries.

SUMMARY

A differential charge pump with open loop common mode is presented. The differential charge pump includes a current steerer that uses a differential control to steer source and sink currents to differential output terminals. In one example, the output terminals are coupled with a common mode regulator which drives a common mode voltage of the differential charge pump. The common mode regulator operates independent from external circuitry and does not require feedback (open loop).

In a further example, the common mode regulator includes a voltage driver coupled with a pair of resistances. The voltage driver may be an inverter having an input coupled to an output in order to establish a voltage that is about half of a power supply voltage. The output of the inverter is coupled with the resistances. A resistance value associated with the resistances may be tailored to prevent a substantial portion of the source and sink currents from entering the common mode regulator.

In another example, the current steerer is coupled with an active regulator. The active regulator reduces overhead voltage associated with a current source which is used to generate the source current. The operating range of the current steerer is thereby increased. In a further example, a second active regulator may be used to reduce overhead associated with sink current generation.

In yet another example, the differential charge pump may employ both an active regulator and a common mode regulator in order to increase operating range and create a desired common mode voltage. These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

A differential charge pump including a common mode regulator and/or an active regulator is presented. The common mode regulator and the active regulator are coupled with a current steerer. The common mode regulator establishes, without a feedback path, the common mode voltage level of the charge pump. In doing so, an erroneous voltage build up which may be associated with asymmetries inherent to the charge pump may be mitigated. The active regulator, on the other hand, increases the amount of input voltage that is distributed to the charge pump. As a result, the output range of the charge pump is also increased.

Figure 1:
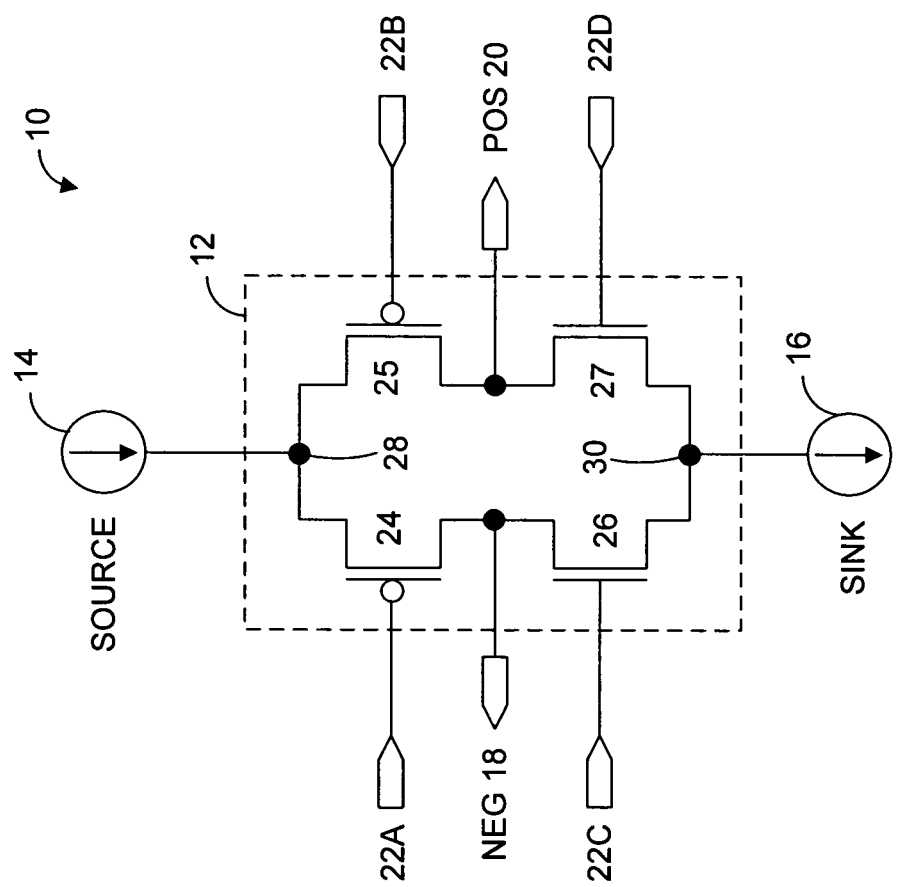
FIG. 1 is a circuit diagram of a differential charge pump.
Figure 2B:
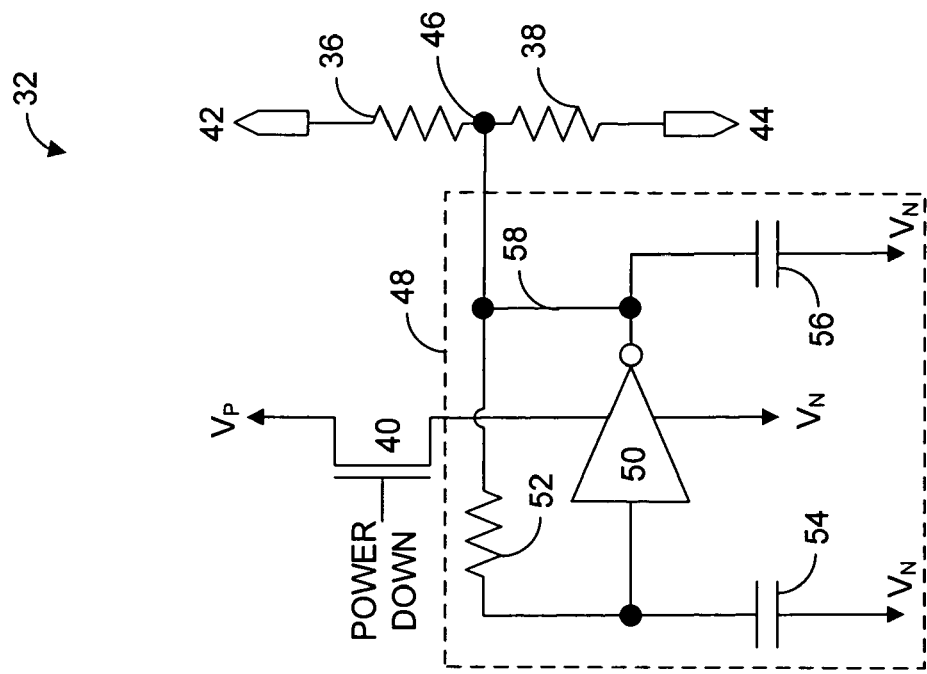
FIG. 2B is a circuit diagram of another common mode regulator.
Figure 2A:
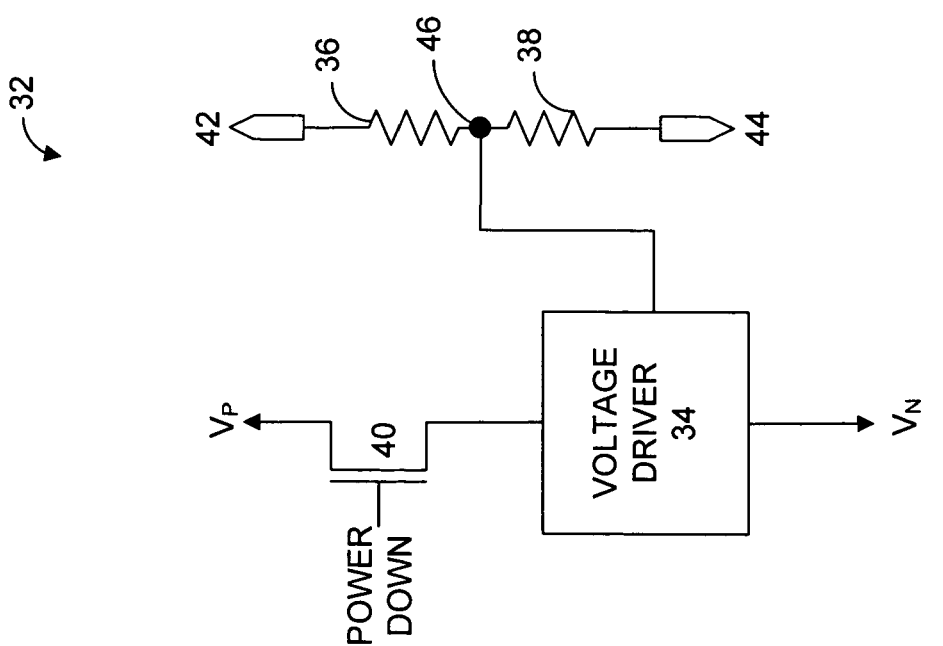
FIG. 2A is a circuit diagram of a common mode regulator.

Turning now to FIG. 2A, an example common mode regulator 32 is illustrated. The common mode regulator includes a voltage driver 34 and resistances 36 and 38. Common mode regulator 32 includes a FET 40, which may be used to turn the common mode regulator on and off. FET 40 may be excluded from the implementation of other common mode regulators, particularly in common mode regulators that are always on.

The output terminals 42 and 44 are respectively coupled to output terminals 18 and 20 of current steerer 12. The resistances 36 and 38 should each have a resistance value that is high enough to prevent a substantial current from traveling through resistance 36 or 38. Depending on the design of the common mode regulator 32, resistances 36 and 38 may have a value such that only a minimal portion of output current (e.g. less than 1%) travels through these resistances. Resistances 36 and 38 may each be a resistor, such as a doped silicon or polysilicon resistor formed in a Complimentary Metal Oxide Semiconductor (CMOS) process, for example.

In order to establish a common mode voltage in a differential charge pump, voltage driver 34 is coupled to node 46 which joins resistance 36 and 38. Voltage driver 34 determines the common mode voltage that is output at output terminals 18 and 20 of the current steerer 12. Voltage driver 34 may be set to a variety of voltages. For example, the common mode voltage may be determined by the technology node (i.e., 5V, 3V, or 1.6V) or an application that a particular differential charge pump is directed to.

Common mode regulator 32 prevents deviation in common mode voltage, and in particular common mode voltage drift, in current steerer 12 by driving the voltages at the output terminals 18 and 20 to the voltage level of the voltage driver 34. Without common mode regulator 32 (and voltage driver 34), deviations in common mode voltage may cause the dynamic range of current steerer 12 to decrease. In addition, other deleterious effects may occur. One effect may be any of the FETS 24-27 becoming pinned at a supply or common voltage, thereby further reducing or eliminating the output range.

Common mode regulator 32, however, prevents unwanted charge build up at terminal 18 or 20, or a voltage from developing across these terminals, by sinking extraneous charge. The common mode regulator 32 may include a ground terminal or common terminal for this purpose. Additionally, because the voltage driver 34 operates independently from the current steerer 12, extraneous charge will not cause its voltage level to drift over time and, as a result, the common mode regulator 32 is coupled with the current steerer 12 in an open loop.

The voltage driver 34 may be designed in a variety of ways. One such voltage driver 48 is illustrated in FIG. 2*b*. Voltage driver 48 includes an inverter 50 having its output coupled in negative feedback to its input. A resistance 52 is also used to couple the input of the inverter to its output. Capacitances 54 and 56 are also included in the voltage driver 48.

The negative feedback configuration of inverter 50 sets the voltage at node 58 to the switching threshold of the inverter 50. For example, if the switching threshold is at 1.5V the voltage at node 58 will be 1.5V and therefore the common mode voltage of the current steerer will also be set to 1.5V. The switching threshold is determined by the design of inverter 50 and, depending on the application, may be adjustable.

Resistance 52 and capacitances 54 and 56 may be used to reduce noise, or glitching, in the switching of FETs 22A-D located in current steerer 12. Resistance 52 and capacitances 54 and 56 may be tailored to a specific current steerer or excluded. Other types of tailoring, such as selecting a mid-rail voltage, may be used to maximize the range of output terminals 18 and 20 of current steerer 12.

Another way to maximize the range of output terminals 18 and 20 is to implement an active regulator. The active regulator maximizes the voltage that is applied to nodes 28 and/or 30. As mentioned above, if a voltage applied to either one of these nodes is distributed across other circuit components subsequent to it being applied to node 28 and/or node 30, the output range of output terminals 18 and 20 will be reduced.

Figure 3B:
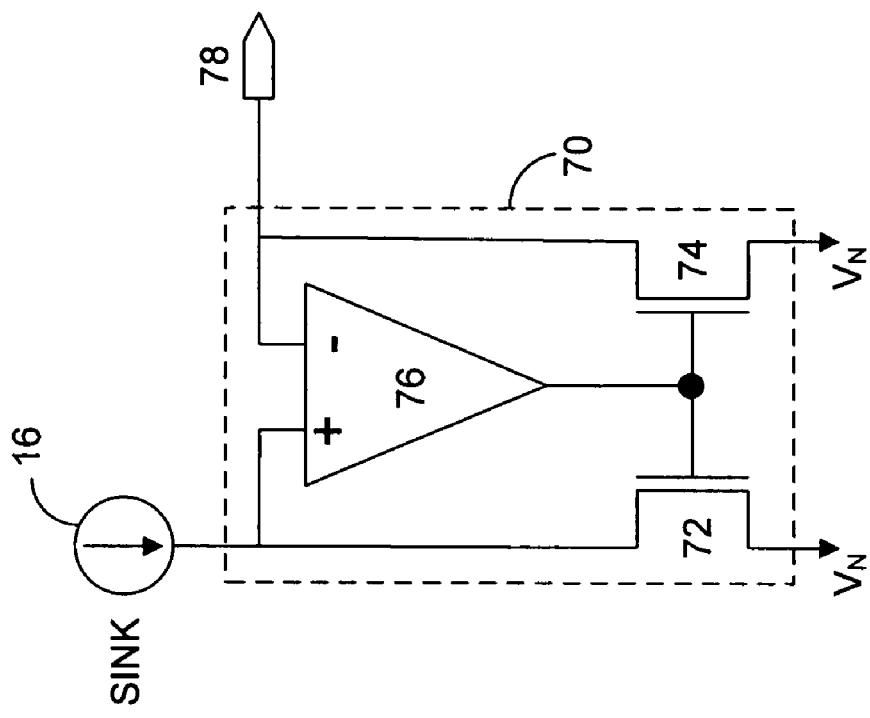
FIG. 3B is a circuit diagram of another active regulator.
Figure 3A:
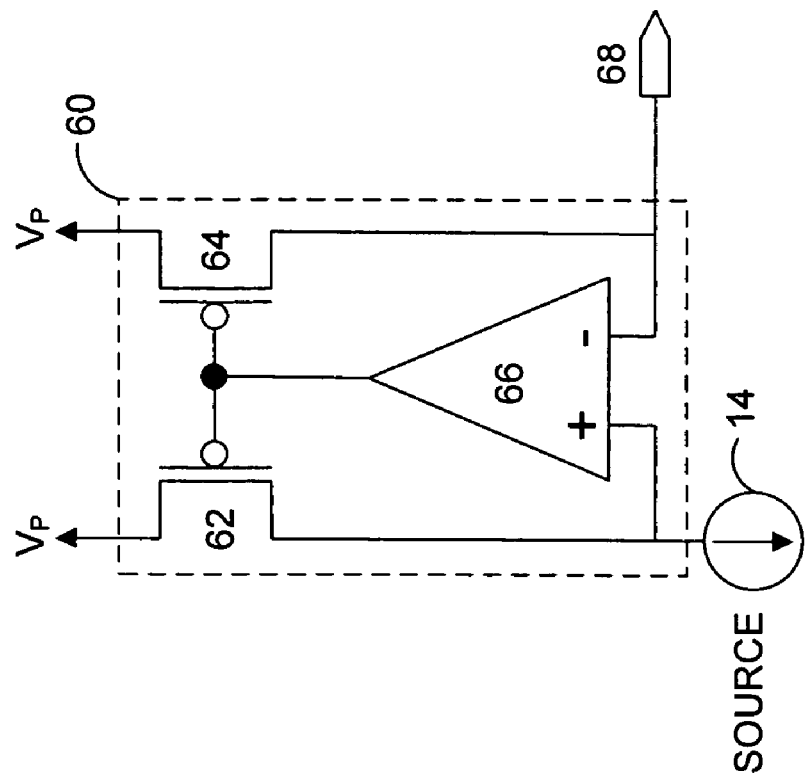
FIG. 3A is a circuit diagram of an active regulator.

FIG. 3A illustrates an example active regulator 60. Active regulator 60 includes a current mirror (formed by FETs 62 and 64) and an amplifier 66. The current mirror mirrors current from current source 14 to output terminal 68. Amplifier 66 has its inputs coupled to the drains of FETs 62 and 64. An output of amplifier 66 is coupled to the gates of FETs 62 and 64. Amplifier 66 may be an operational amplifier, for example.

The output of amplifier 66 supplies a voltage that allows both FETs 62 and 64 to turn "on". The supply voltage, $V_P$, is pulled to the output terminal 68 and to both input terminals of amplifier 66. The voltages between the drains of FETs 62 and 64 (amplifier 66's input terminals) cannot deviate significantly from each other without increasing the current through FETs 62 and 64. Therefore, the drains of FETs 62 and 64 will both maintain a voltage that is about equal to the supply voltage. In addition, the current mirror will mirror the source current to output terminal 68. As a result, the active regulator 66 allows the source current to be supplied to output terminal 68 without reducing the voltage level at output terminal 68. Output terminal 68 may be coupled to node 28 of the current steerer 12 to provide the source current and supply voltage.

A second supply, or common supply, voltage can also be coupled with a second active regulator that is coupled to the current steerer 12. Example active regulator 70 is illustrated in FIG. 3B. Active regulator 70 also includes a current mirror (FETs 72 and 74) coupled to an amplifier 76. Output terminal 78 is coupled to one input terminal of amplifier 76. The other input terminal of amplifier 76 is coupled to current sink 16. The output terminal 78 provides both the sink current and the common supply voltage $V_N$ to node 30 of the current steerer 12. In the same manner as active regulator 60, the common supply voltage supplied to output terminal 78 is optimized as it is directly distributed to current steerer 12 and does not have to be "dropped" across current sink 16 prior to being communicated to node 30.

Figure 4:
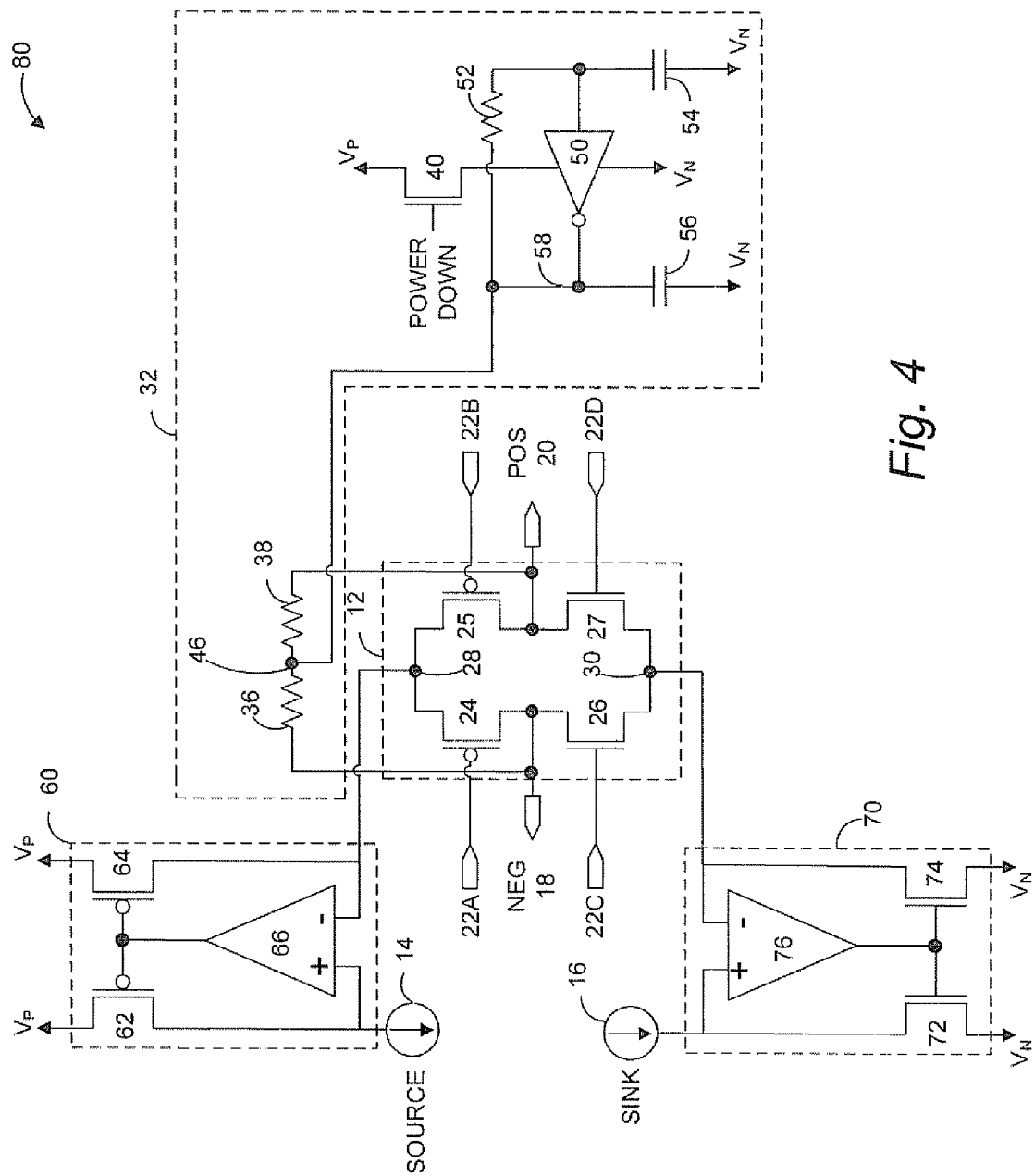
FIG. 4 is a circuit diagram of a differential charge pump including a common mode regulator and two active regulators.

All of the above examples may be used in combination to create a differential charge pump. For example, FIG. 4 is a circuit diagram of differential charge pump 80 including common mode regulator 32, active regulator 60, and active regulator 70 all coupled to current steerer 12. Differential charge pump 80 offers an improved operating voltage range and a common mode voltage that is determined without feedback.

Overall, the above examples describe a differential charge pump that offers an improved output range of lower operating voltages. As described above, these lower operating voltages may be associated with decreasing transistor sizes. The differential charge pump may include active and/or common mode voltage regulators. Although several example circuit structures have been shown, the present application should not be viewed as limited to these examples. A variety of structures and implementations may be realized that would be analogous and apparent to one skilled in the art. Additionally, the output of the differential charge pump may be a voltage or a current. The claims should not be read as limited to the described order or elements unless stated to that effect. Therefore, all examples that come within the scope and spirit of the following claims and equivalents thereto are claimed as the invention.

We claim:

1. A differential charge pump, comprising:
   a current steerer comprising:
   first and second output terminals for outputting a differential current;
   first and second input terminals, the first input terminal receiving a source current, the second input terminal receiving a sink current;
   a differential control for steering the source and sink currents to the first and second output terminals; and
   a common mode regulator comprising:
   first and second resistances each having a first and a second terminal, the first terminal of the first and second resistances coupled together, the second terminal of the first and second resistances respectively coupled to the first and second output terminals of the current steerer; and
   a voltage driver coupled to the first terminal of the first and second resistances, the voltage driver establishing a common mode voltage that drives the first and second output terminals of the current steerer to the common mode voltage, wherein the voltage driver is an inverter having an input terminal, an output terminal and a supply terminal, the inverter being coupled to a supply voltage at the supply terminal, the input terminal of the inverter being coupled to the output terminal of the inverter so as to output the common mode voltage at the output terminal of the inverter, and the common mode voltage having a voltage level associated with a switching threshold of the inverter.

2. The differential charge pump as in claim 1, wherein the first and second resistances each have a substantial resistance value so as to only allow a minimal portion of the differential current to pass through the first and second resistances.

3. The differential charge pump as in claim 1, wherein a third resistance is coupled between the input and output terminals of the inverter.

4. The differential charge pump as in claim 1, wherein the voltage driver further comprises a first capacitor coupled to the input terminal of the inverter and a second capacitor coupled to the output terminal of the inverter.

5. The differential charge pump as in claim 1, further comprising a first active regulator having first and second reference terminals, the first reference terminal of the first active regulator coupled to the first input terminal of the current steerer, the second reference terminal of the first active regulator coupled to a first reference source, the first active regulator, in operation, minimizing a first voltage difference between a first supply voltage and the first input terminal of the current steerer.

6. The differential charge pump as in claim 5, further comprising a second active regulator having first and second reference terminals, the first reference terminal of the second active regulator coupled to the second input terminal of the current steerer, the second reference terminal of the second active regulator coupled to a second reference source, the second active regulator, in operation, minimizing a second voltage difference between a second supply voltage and the input terminal of the current steerer.

7. The differential charge pump as in claim 5, wherein the first active regulator comprises an amplifier coupled with a current mirror, the amplifier having first and second input terminals coupled with the respective first and second reference terminals of the first active regulator, and the amplifier having an output terminal coupled with an input of the current mirror.

8. The differential charge pump as in claim 7, wherein the current mirror comprises first and second Field Effect Transistors (FETs) each having a gate, a source, a drain, and an associated operating current, the gates of the first and second FETs being coupled to the output terminal of the amplifier, the drain of the first FET being coupled to the first reference source, the drain of the second FET being coupled to the first input terminal of the current steerer, the associated operating current of the first FET being determined by the first reference source, and the associated operating current of the second FET being the source current.

9. The differential charge pump as in claim 6, wherein the first active regulator includes a first operational amplifier coupled with a first current mirror and the second active regulator includes a second operational amplifier coupled with a second current mirror, the first operational amplifier having first and second inputs respectively coupled to the source current and the first input terminal, and the second operational amplifier having first and second inputs respectively coupled to the sink current and the second input terminal.

10. The differential charge pump as in claim 1, wherein the current steerer comprises first, second, third, and fourth Field Effect Transistors (FETs) each having a gate, a source, and a drain, the sources of the first and second FETs providing the first input terminal of the current steerer, the sources of the third and fourth FETs providing the second input terminal of the current steerer, the drains of the first and third FETs being intercoupled and providing the first output terminal of the current steerer, the drains of the second and fourth FETs being intercoupled and providing the second output terminal of the current steerer, and the gates of the first, second, third, and fourth FETs providing the differential control of the current steerer.

11. The differential charge pump as in claim 9, wherein the first and second FETs are p-type and the third and fourth FETs are n-type.

12. The differential charge pump as in claim 1, wherein the common mode regulator establishes the common mode voltage without feedback from circuitry external to the common mode regulator.

* * * * *